US008184225B2

(12) United States Patent
Tomiyasu

(10) Patent No.: US 8,184,225 B2

(45) Date of Patent: May 22, 2012

(54) SEMICONDUCTOR DEVICE, PRODUCTION METHOD THEREOF, AND DISPLAY DEVICE

(75) Inventor: Kazuhide Tomiyasu, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 1085 days.

(21) Appl. No.: 11/990,915

(22) PCT Filed: Jun. 14, 2006

(86) PCT No.: PCT/JP2006/311957

§ 371 (c)(1), (2), (4) Date: Feb. 25, 2008

(87) PCT Pub. No.: WO2007/029389

PCT Pub. Date: Mar. 15, 2007

(65) Prior Publication Data

US 2009/0242893 A1 Oct. 1, 2009

(30) Foreign Application Priority Data

Sep. 5, 2005 (JP) ................................ 2005-257040

(51) Int. Cl.
*G02F 1/136* (2006.01)

(52) U.S. Cl. ............................ 349/43; 349/138; 257/59

(58) Field of Classification Search ..................... 349/43
See application file for complete search history.

(56) References Cited

U.S. PATENT DOCUMENTS

| | | | |
|---|---|---|---|
| 6,097,453 A * | 8/2000 | Okita | 349/43 |
| 6,961,111 B1 | 11/2005 | Kuramasu | |
| 2004/0061176 A1 | 4/2004 | Takafuji et al. | |

FOREIGN PATENT DOCUMENTS

| | | |
|---|---|---|
| JP | 6-37313 | 2/1994 |
| JP | 6-75244 | 3/1994 |
| JP | 09-127352 | 5/1997 |
| JP | 11-024106 | 1/1999 |
| JP | 2000-36598 | 2/2000 |
| JP | 2001-154218 | 6/2001 |
| JP | 2002-287653 | 10/2002 |
| JP | 2004-165600 | 6/2004 |

OTHER PUBLICATIONS

International Search Report for PCT/JP2006/311957 mailed Sep. 12, 2006.

* cited by examiner

*Primary Examiner* — Richard Kim

(74) *Attorney, Agent, or Firm* — Nixon & Vanderhye P.C.

(57) ABSTRACT

The present invention provides a semiconductor device which can be produced by simple and cheap processes and effectively achieve improved performances and a reduced electric power consumption. Further, the present invention provides a production method thereof and a display device including the semiconductor device or a semiconductor device produced by the production method. The present invention is a semiconductor device including a pixel part and an integrated circuit part on a substrate, the pixel part including a switching element having a gate electrode formed on a semiconductor thin film, the integrated circuit part including a semiconductor layer on a gate electrode, wherein a passivation film is formed on the gate electrode in the pixel part.

17 Claims, 8 Drawing Sheets

SEMICONDUCTOR DEVICE, PRODUCTION METHOD THEREOF, AND DISPLAY DEVICE

This application is the U.S. national phase of International Application No. PCT/JP2006/311957 filed 14 Jun. 2006 which designated the U.S. and claims priority to Japanese Patent Application No. 2005-257040 filed 5 Sep. 2005, the entire contents of each of which are hereby incorporated by reference.

TECHNICAL FIELD

The present invention relates to a semiconductor device, a production method thereof, and a display device. More specifically, the present invention relates to a semiconductor device which includes a pixel and a driver on the same substrate and can be preferably used in an active matrix substrate used in a display device such as a liquid crystal display device, an organic electroluminescent display device; a production method of such a semiconductor device; and a display device including the semiconductor device or a semiconductor device produced by the production method.

BACKGROUND ART

A semiconductor device is an active element-including electronic device using electrical characteristics of a semiconductor. Such a semiconductor device has been widely used in an audio device, a communication device, a computer, an electric appliance and the like. Among these, a semiconductor device including a three-terminal active element such as a thin film transistor (hereinafter, also referred to as a "TFT"), a MOS (Metal Oxide Semiconductor) transistor has been used as a switching element formed in each pixel, a control circuit for controlling each pixel, in a display device such as an active matrix liquid crystal display device (hereinafter, also referred to as a "liquid crystal display"). Such a semiconductor device permits a higher-definition display device and enables such a display device to fast display moving images.

A liquid crystal display including a peripheral driving circuit such as a driving circuit and a control circuit integrally formed with a pixel part, a so-called monolithic liquid crystal display (hereinafter, also referred to as a "system liquid crystal") has been brought to attention (for example, refer to Patent Documents 1 and 2). According to a semiconductor device used in such a system liquid crystal, the switching element in the pixel part and the peripheral driver circuit are simultaneously formed on the same substrate. Accordingly, the number of components is significantly reduced and an assembling step, an examination step and the like of the liquid crystal display device can be reduced. As a result, a reduction in production costs and an improvement in reliability are permitted.

For a display device such as a liquid crystal display device, a reduction in electric power consumption and an improvement in performances such as a higher-definition image and a high-speed image display are strongly needed. A reduction in a space for the peripheral driver in the system liquid crystal is also needed.

Therefore, for a semiconductor device used in a display device, each element strongly needs to be further finely formed. In order to form more elements in a limited area, a design rule of a submicron order, that is, a pattern definition that is fine enough to be adopted to an integrated circuit (hereinafter, also referred to as an "IC"), is needed for the peripheral driver circuit. Further, a semiconductor element in the peripheral driver circuit needs to improve a carrier mobility of a semiconductor layer. Because of this need, the semiconductor element must be finely formed.

However, according to a conventional production process of forming a semiconductor device directly on a glass substrate, the glass substrate has insufficient heat resistance and therefore it might be distorted in a heat treatment step during production processes. Therefore, a desired circuit pattern of submicron order cannot be formed. Further, the glass substrate used for producing a liquid crystal display device such as a system liquid crystal has become larger. Therefore, the glass substrate surface is more easily distorted during the production processes.

For this problem, a technology of transferring a driver IC on a liquid crystal display substrate using a SOI (Silicon On Insulator) substrate in which a driver IC is formed in a single crystal silicon layer formed on an electrical insulator (for example, refer to Patent Document 3). According to this, an IC including a semiconductor element such as a MIS (Metal Insulator Semiconductor) can be formed through a conventional IC tip preparation step. Therefore, a semiconductor device including a fine and high-performance IC having a desired circuit design of submicron order can be produced. However, a step of preparing the SOI substrate is separately needed, which complicates the production processes and increases the production costs. In such a point, there is room for improvement.

Thus, the IC used in a peripheral driver of a system liquid crystal needs to be inexpensively produced by simple production processes. Further, in such an IC, an improvement in performances and a reduction in an electric power consumption needs to be realized by, for example, finely forming an element and a circuit pattern.

[Patent Document]
Japanese Kokai Publication No. Hei-06-37313
[Patent Document 2]
Japanese Kokai Publication No. 2000-36598
[Patent Document 3]
Japanese Kokai Publication No. Hei-06-75244

DISCLOSURE OF INVENTION

The present invention has been made in view of the above-mentioned state of the art. The present invention has an object to provide a semiconductor device which can be produced by simple and cheap production processes and effectively achieve improved performances and a reduced electric power consumption, and a production method thereof, and further, a display device including the semiconductor device or a semiconductor device produced by the production method.

The present inventor made various investigations on production processes of a semiconductor device including a pixel part and an IC part on the same substrate, used in a system liquid crystal and the like. The inventor noted that using a technology of transferring an integrated circuit chip (IC chip) formed on a single crystal semiconductor wafer to a substrate, the IC part can be finely formed by simple and cheap production processes. Then, the inventor found that according to such a technology, when the semiconductor layer in the transferred IC part is etched to be thinned, thereby separating channel regions of respective semiconductor elements from each other, a gate electrode formed on a semiconductor thin film in the pixel part is damaged. Then, the inventor further made various investigations and found that if a passivation film is formed on the gate electrode in the pixel part, the semiconductor layer in the IC part can be thinned by etching and the like while the gate electrode in the pixel part is suppressed from being damaged. Further, the inventor found that using a technology of transferring an IC chip formed on a single crystal semiconductor wafer to a substrate, an improvement in the performances and a reduction in the electric power consumption of the semiconductor device are effectively permitted. As a result, the above-mentioned problems have been admirably solved, leading to completion of the present invention.

That is, the present invention relates to a semiconductor device including a pixel part and an integrated circuit part on a substrate, the pixel part including a switching element having a gate electrode formed on a semiconductor thin film, the integrated circuit part including a semiconductor layer on a gate electrode, wherein a passivation film is formed on the gate electrode in the pixel part.

According to the semiconductor device of the present invention, a pixel part including a switching element having a gate electrode formed on a semiconductor thin film, and an IC part including a semiconductor layer on a gate electrode are arranged on a substrate. That is, according to the semiconductor device of the present invention, a pixel part and an IC part are formed on a substrate; the pixel part has a configuration in which a semiconductor thin film and a gate electrode (gate in the pixel part) are formed in this order from the substrate side; and the IC part has a configuration in which a gate electrode (gate in the IC part) and a semiconductor layer are formed in this order from the substrate side. Between the semiconductor thin film and the gate in the pixel part, a gate insulating film is generally formed. Further, a gate oxide film is generally formed between the gate in the IC part and the semiconductor layer. In addition, the IC part is generally arranged on the substrate by transferring a part (an IC chip) of a semiconductor wafer including a semiconductor element to the substrate. Each switching element in the pixel part can be driven and controlled by the IC part because the semiconductor device of the present invention has such a configuration. Further, the semiconductor device includes the pixel part and the IC part on the same substrate, and therefore the number of components as well as the assembling step and examination step can be reduced, which permits a reduction in production costs and an improvement in reliability.

The above-mentioned switching element is a semiconductor element which is driven and controlled by the IC part and switches ON/OFF of each circuit in the pixel part in accordance with a voltage applied to the gate electrode. The switching element is not especially limited, and a MOS transistor, an MIM (Metal Insulator Metal) diode, a varistor and the like maybe mentioned. In view of performances and production costs, a three-terminal active element is preferable, and particularly, a thin film transistor is more preferable.

A material which is easily patterned by dry etching and the like is preferable as the material for the above-mentioned gate electrode in the pixel part. High melting point metals having a melting point of 2000° C. or more are preferable in order to suppress plastic deformation such as hillock in a heat treatment process. Specifically, preferable examples of the material for the gate electrode include high melting point metals such as tungsten (W), molybdenum (Mo), tantalum (Ta), and titanium (Ti), and nitrides of such high melting point metals. The gate electrode may be a stacked body including two or more materials. The above-mentioned gate electrode is preferably formed by forming a metal film by a sputtering method, and then patterning the metal film by dry etching using a photoresist and the like as a mask.

According to the above-mentioned semiconductor device, a passivation film is formed on the gate electrode in the pixel part. In the present invention, the passivation film includes an insulating film and protects the gate electrode in the pixel part when the semiconductor layer in the IC part is thinned. The passivation film preferably has a protective function (resistance) to etching, more preferably has a protective function to dry etching because etching such as dry etching and wet etching is preferably used for thinning the semiconductor layer in the IC part. Attributed to such a passivation film, the semiconductor layer in the IC part can be thinned by etching and the like while the gate electrode in the pixel part is suppressed from being damaged if the IC part is formed by transferring a part of a semiconductor wafer including a semiconductor element and then the semiconductor layer in the IC part is thinned, thereby separating the channel regions of respective semiconductor elements from each other. As a result, according to the semiconductor device of the present invention, the semiconductor element and the circuit pattern in the IC part can be finely formed by forming the IC part by transferring. In addition, the semiconductor layer is thinned, and thereby a parasitic capacitance is reduced. Therefore, a high-speed operation, a low-voltage drive, and a low electric power consumption in the IC part are permitted. As a result, the semiconductor device can effectively achieve improved performances and a reduced electric power consumption.

In order to sufficiently suppress the gate electrode from being exposed by etching of the passivation film, it is preferable that the passivation film includes a material having an etch selectivity of 1.5 or more relative to the semiconductor layer in the integrated circuit part. More preferably, the passivation film includes a material having an etch selectivity of 2.0 or more. The above-mentioned selectivity is a value calculated based on a ratio of an etching rate between the passivation film and the semiconductor layer in the IC part when a mixed gas of carbon tetrafluoride gas and oxygen gas is used as a gas to perform dry etching.

In the present description, the terms "or more" and "or less" mean that the value described is included.

An inorganic insulating material is preferable as a material for the above-mentioned passivation film. Examples of the inorganic insulating material include silicon oxide, silicon nitride, and silicon oxynitride. Among these, TEOS (tetra ethoxy silane) is more preferable. A plurality of layers may form the passivation film, but preferably a single layer forms the passivation film in view of simplification of the production steps.

It is preferable that the passivation film has an average thickness of 50 nm or more. If the passivation film has an average thickness of less than 50 nm, the gate electrode might be exposed due to uneven film thickness generated when the semiconductor layer is thinned. It is preferable that the average film thickness is 150 nm or more in order to more surely prevent the gate electrode from being exposed. The upper limit of the average thickness of the passivation film is not especially limited, but generally 300 nm or less.

In the present invention, the passivation film covers at least the gate electrode in the pixel part. For example, if the gate electrodes are arranged in an island pattern on the gate insulating film in the pixel part, the passivation film is formed on the gate electrode and the gate insulating film around the gate electrode in the pixel part, thereby protecting the gate insulating film.

The semiconductor device of the present invention may or may not include other components as long as it essentially includes the above-mentioned components. The configuration of the semiconductor device is not especially limited.

In the present invention, it is preferable that the semiconductor layer in the integrated circuit part includes single crystal silicon. The single crystal silicon has a carrier mobility larger than that of amorphous silicon and polycrystal silicon, which permits a high-speed operation of the IC part. Further, a CMOS transistor can be formed in the IC part, and therefore the stability of the circuit can be secured and the electric power consumption of the IC part can be reduced.

In the present invention, it is preferable that an interlayer insulating film is formed on the passivation film. As a result, an interlayer capacitance can be appropriately determined while the pixel part is protected. It is more preferable in the above-mentioned semiconductor device that an interlayer insulating film is formed on the passivation film in the pixel part and the semiconductor layer in the IC part. Thus, the interlayer insulating film is uniformly formed in the pixel part and the IC part, thereby protecting the semiconductor layer not only in the pixel part but also in the IC part. An inorganic or organic insulating material is preferable as the material for the interlayer insulating film. Among these, an inorganic insulating material is preferable. Silicon nitride, TEOS and the like may be mentioned as the inorganic insulating material. A resin such as a photosensitive resin may be mentioned as the organic insulating material. The thickness of the interlayer insulating film is not especially limited. It is preferable that the interlayer insulating film has an average thickness of 300 to 1500 nm. The interlayer insulating film may be a stacked body including two or more materials of silicon nitride, TEOS and the like.

The present invention also relates to a production method of a semiconductor device including a pixel part and an integrated circuit part on a substrate, the pixel part including a switching element having a gate electrode formed on a semiconductor thin film, the integrated circuit part including a semiconductor layer, the method including the steps of: (1) transferring a part of a semiconductor wafer to the substrate, thereby forming the integrated circuit part (transferring step); (2) forming a passivation film on the gate electrode in the pixel part (passivation film formation step); and (3) thinning a semiconductor layer in the integrated circuit part (film thinning step).

According to the production method of the semiconductor device in the present invention, a semiconductor element formed on a semiconductor wafer can be transferred to the substrate in the above-mentioned transferring step (1). Therefore, an IC part having a fine circuit pattern and the pixel part can be easily formed on the same substrate by simple and cheap production processes. The part of the semiconductor wafer is generally an integrated circuit chip (IC chip) including a plurality of semiconductor elements. Then, a passivation film can be formed on the gate electrode in the pixel part in the above-mentioned passivation film formation step (2). As a result, in the above-mentioned film thinning step (3), the semiconductor layer in the IC part can be thinned while the gate electrode in the pixel part is suppressed from being damaged by etching and the like. According to the production method of the semiconductor device of the present invention, the IC part is formed by transferring, thereby finely forming the semiconductor element and the circuit pattern in the IC part. In addition, the semiconductor layer is thinned, and thereby a parasitic capacitance is reduced. Therefore, a high-speed operation, a low-voltage drive, and a low electric power consumption in the IC part are permitted. As a result, the semiconductor device can effectively achieve improved performances and a reduced electric power consumption.

The production method of the semiconductor device of the present invention is preferably used as a method for producing the above-mentioned semiconductor device of the present invention.

The production method of the semiconductor device of the present invention is not especially limited and may or may not include other steps as long as it essentially includes the above-mentioned transferring step (1), the above-mentioned passivation film formation step (2), and the above-mentioned film thinning step (3). The order of the above-mentioned steps (1) to (3) is not especially limited as long as the effects of the present invention are exhibited. It is preferable that the above-mentioned steps (1), (2), and (3) are performed in this order or in order of (2), (1), and (3). In order to prevent the gate electrode in the pixel part from being oxidized in the heat treatment step of activating an impurity element, it is more preferable that the above-mentioned steps (2), (1), and (3) are performed in this order.

It is preferable in the above-mentioned transferring step (1) that the IC chip is transferred to the substrate in such a way that the semiconductor layer is the uppermost layer. According to this, the semiconductor layer in the IC part is thinned by etching and the like in the film thinning step (3).

It is preferable in the above-mentioned passivation film formation step (2) that the passivation film made of a material having an etch selectivity of 1.5 or more relative to the semiconductor layer in the IC part is formed. More preferably, the passivation film made of a material having an etch selectivity of 2.0 or more is formed. According to this, the semiconductor layer in the IC part can be selectively etched without using an etching mask in the above-mentioned film thinning step (3). Therefore, the productivity can be improved. The above-mentioned selectivity can be calculated by the above-mentioned method.

In the above-mentioned passivation film formation step (2), it is preferable that a passivation film having an average thickness of 400 nm or more is formed in order to prevent the gate electrode from being exposed in the above-mentioned film thinning step (3). According to this, the gate electrode is effectively suppressed from being exposed by etching of the passivation film in the above-mentioned film thinning step (3). Further, after completion of the etching, a passivation film having an average thickness of about 150 nm can be obtained. The upper limit of the average thickness of the passivation film formed in the above-mentioned passivation film formation step (2) is not especially limited, but it is preferably 500 nm or less.

The method of forming the passivation film is not especially limited. A sputtering method, a normal pressure CVD (Chemical Vapor Deposition) method, a low pressure CVD method, a plasma CVD method, a remote plasma CVD method and the like may be used.

It is preferable that etching is performed in the film thinning step (3). According to this, the semiconductor layer in the IC part can be selectively thinned without damaging the gate electrode in the pixel part, on which the passivation film having a large etch selectivity is formed.

The above-mentioned etching may be performed by wet etching or dry etching, and dry etching is preferable because the film thickness can be easily controlled.

A gas used in the dry etching is not especially limited. A mixed gas of carbon tetrafluoride gas and oxygen gas, a mixed gas of sulfur hexafluoride gas and hydrogen chloride gas and the like may be mentioned. A PE (plasma etching) mode, an RIE (reactive ion etching) mode and the like may be used for the dry etching.

If wet etching is employed, a chemical to be used is not especially limited. A potassium hydroxide aqueous solution, a mixed solution of fluoric acid and nitric acid, EDP (ethylene diamine pyrocatechol) and the like may be mentioned.

In the above-mentioned film thinning step (3), it is preferable that a part of the semiconductor layer in the IC part is thermally separated before the etching. Thus, the part of the semiconductor layer is separated and removed, and then the etching is performed. As a result, the time for the etching can be reduced, leading to a reduction in time for the production processes.

The method of the thermal separation is not especially limited. A method of injecting ions of hydrogen or an inert gas element such as helium (He) and neon (Ne) into the semiconductor layer to a desired depth, and then separating the semiconductor layer along the ion-injected layer by a heat treatment, a so-called smart-cut method (registered trademark) is preferable.

It is preferable that the production method further includes a step of forming an interlayer insulating film on the passivation film in the pixel part after the step of thinning the semiconductor layer. According to this, the interlayer insulating film can be formed in the pixel part without being influenced by the etching in the film thinning step. It is more preferable that the production method further includes a step of forming an interlayer insulating film on the passivation film in the pixel part and on the semiconductor layer in the IC part after the step of thinning the semiconductor layer. Thus, the interlayer insulating film is uniformly formed in the pixel part and the IC part, thereby easily forming the insulating film for protecting the semiconductor layer not only in the pixel part but also in the IC part. An organic or inorganic insulating material is preferable as the material for the interlayer insulating film. Particularly, an inorganic insulating material is preferable. Silicon nitride and TEOS are mentioned as the inorganic insulating material. A resin such as a photosensitive resin is mentioned as the organic insulating material. The method of forming the interlayer insulating film is not especially limited. A sputtering method, a normal pressure CVD method, a low pressure CVD method, a plasma CVD method, a remote plasma CVD method and the like may be mentioned if the inorganic material is formed. A spin coating method and the like is mentioned if the organic material is formed. The interlayer insulating film may be formed to have a multilayer structure including two or more materials of silicon nitride, TEOS and the like.

According to a semiconductor device produced by the production method of the semiconductor device of the present invention, a pixel part including a switching element having a gate electrode formed on a semiconductor thin film, and an integrated circuit part including a semiconductor layer are formed on a substrate. As long as the semiconductor device produced by the production method of the semiconductor device in the present invention essentially include such components, other components are not especially limited.

The present invention is also a display device including the semiconductor device or a semiconductor device produced by the production method. The semiconductor device of the present invention includes the pixel part and the IC part on the same substrate and the IC part is used as a peripheral circuit of a display device, such as a digital driver, a DC-DC converter, a DAC (Digital to Analog Converter), and an RF (radio-frequency radiation) circuit. Therefore, the semiconductor device of the present invention can be preferably used in a display device including an active matrix substrate having a pixel part and an IC part on the same substrate. Accordingly, the display device of the present invention is preferably used in a display device such as a liquid crystal display device and an organic electroluminescent display device (organic EL display). Particularly, the semiconductor device of the present invention includes the IC part which has improved performances and a reduced electric power consumption. Therefore, such a semiconductor device can be particularly preferably used in a large liquid crystal display device or organic EL display.

EFFECT OF THE INVENTION

According to the semiconductor device of the present invention, the passivation film is formed on the gate electrode in the pixel part. Therefore, the semiconductor layer in the IC part can be thinned while the gate electrode in the pixel part is suppressed from being damaged by etching and the like, when the pixel part and the IC part that is a part of the semiconductor wafer are arranged on the same substrate. Further, the IC part of the semiconductor device in the present invention is formed by transferring, and therefore the element and the circuit pattern in the IC part can be finely formed. In addition, the semiconductor layer is thinned, and thereby a parasitic capacitance is reduced. Therefore, a high-speed operation, a low-voltage drive, and a low electric power consumption in the IC part are permitted. As a result, the semiconductor device can effectively achieve improved performances and a reduced electric power consumption.

BEST MODES FOR CARRYING OUT THE INVENTION

The present invention is mentioned in more detail below with reference to the following Embodiment using drawings, but the present invention is not limited thereto.

With respect to a MOS transistor in an IC part of the present Embodiment, one NMOS transistor is mentioned, but a semiconductor device in accordance with the present Embodiment includes a plurality of NMOS and PMOS transistors on the same substrate. The PMOS transistors can be formed by changing a conductive type of an injected impurity ion when the NMOS transistor is formed. The PMOS and NMOS transistors may not be, but preferably electrically connected to each other. A CMOS transistor (complementary circuit) including PMOS and NMOS transistors is preferable, for example. The MOS transistors are appropriately separated from each other by LOCOS (Local Oxidation Of Silicon), trench isolation, and the like.

The PMOS transistor means a MOS transistor including a channel layer composed of a p-type semiconductor. The NMOS transistor means a MOS transistor including a channel layer composed of an n-type semiconductor.

Embodiment 1

An active matrix substrate for display devices, including the semiconductor device of the present invention, is mentioned with reference to FIG. 1. FIG. 1 is a cross-sectional view schematically showing a configuration of an active matrix substrate for display devices, in accordance with the present Embodiment. As shown in FIG. 1, the active matrix substrate in the present Embodiment includes a glass substrate 22 that is a transparent substrate, an IC part 50 and a pixel part 51 each arranged on the glass substrate 22, and a wiring part 37 connecting a TFT 30 in the pixel part 51 to the IC part 50.

The pixel part 51 includes the TFT 30 on a first base coat layer 31 and a second base coat layer 32 successively formed on the glass substrate 22.

The TFT 30 includes: a semiconductor thin film 33 including an active region; a gate insulating film 34 covering the semiconductor thin film 33; a gate electrode (gate in the pixel part) 35 formed on the gate insulating film 34; and a passivation film 36 covering the gate electrode 35, in this order. The semiconductor thin film 33 includes a source region 33*s*, a drain region 33*d*, a channel region 33*c* formed between the source region 33*s* and the drain region 33*d*. The passivation film 36 is generally formed on the substantially entire surface of the pixel part 51.

On the TFT 30 of the pixel part 51, an interlayer insulating film 40, a flattening film 42, and a pixel electrode 41 are stacked in this order. Further, in the TFT 30, contact holes 39*d* and 39*s* are formed on the drain region 33*d* and the source region 39*s*, respectively, to penetrate the gate insulating film 34, the passivation film 36, and the interlayer insulating film 40. A conductive material is charged inside the contact holes 39*d* and 39*s* and on the interlayer insulating film 40, thereby forming electrode wirings 43*a* and 43*b* on the interlayer film. A contact hole 44*a* is formed on the electrode wiring 43*a* to penetrate the flattening film 42. A pixel electrode 41 that is a transparent electrode is formed inside the contact hole 44*a* and on the flattening film 42. The pixel electrode 41 is connected to the drain region 33*d* of the TFT 30. As the uppermost layer in the pixel part 51, an alignment film (not shown) is arranged.

The IC part 50 includes a MOS transistor 52 that is a semiconductor element, arranged on the glass substrate 22 surface. In the MOS transistor 52, an insulating film 21 that is a first flattening film, an interlayer insulating film 18 that is a second flattening film, an interlayer insulating film 15, and an insulating film 14 are stacked on the glass substrate 22 in this order. The insulating film 21 is bonded to the glass substrate 22 surface. The insulating film 14 has a depression toward the glass substrate 22. On the insulating film 14 surface, a gate oxide film 7 and an LOCOS oxide film 6 are formed. Between the gate oxide film 7 and the insulating film 14, a gate electrode (gate in the IC part) 8 and a sidewall 11 are formed. The sidewall 11 is formed on the right and left ends of the gate electrode 8.

In addition, a source electrode 20*s* and a drain electrode 20*d* are formed in the interface between the insulating film 21 and the interlayer insulating film 18. Contact holes 19*s* and 19*d* are formed to penetrate the interlayer insulating films 18 and 15, the insulating film 14, and the gate oxide film 7. Conductive materials are charged into the contact holes 19*s* and 19*d*, respectively. The conductive material inside the contact hole 19*s* is integrally formed with the source electrode 20*s* and the conductive material inside the contact hole 19*d* is integrally formed with the drain electrode 20*d*.

On the gate oxide film 7 surface, a semiconductor layer 1 that is a single crystal silicon layer is formed. The semiconductor layer 1 is covered with the interlayer insulating film 40 and the flattening film 42 which are common members with the pixel part 51 under the state where the LOCOS oxide film 6 separates the semiconductor layer 1 from adjacent another semiconductor layer (not shown).

The semiconductor layer 1 includes: a channel region 12; low concentration impurity regions 10*s* and 10*d* formed with the channel region 12 therebetween; and further high concentration impurity regions 13*s* and 13*d* formed with the channel region 12 and the low concentration impurity regions 10*s* and 10*d* therebetween. Into the low concentration impurity regions 10*s* and 10*d* and high concentration impurity regions 13*s* and 13*d*, N-type impurities 16 such as phosphorus are injected. The low concentration impurity regions 10*s* and 10*d* constitute a so-called LDD (Lightly Doped Drain) region. The high concentration impurity region 13*s* constitutes a source region and the high concentration impurity region 13*d* constitutes a drain region.

The channel region 12 is formed to face the gate electrode 8 with the gate oxide film 7 therebetween. The low concentration impurity regions 10*s* and 10*d* are formed to face the sidewall 11 with the gate oxide film 7 therebetween. In addition, the high concentration impurity region 13*s* is connected to the source electrode 20*s* through the contact hole 19*s*. The high concentration impurity region 13*d* is connected to the drain region 20*d* through the contact hole 19*d*. A contact hole 38 is formed on the source electrode 20*s* to penetrate the interlayer insulating films 18 and 15, the insulating film 14, the LOCOS oxide film 6, and the interlayer insulating film 40. A conductive material is charged inside the contact hole 38 and on the interlayer insulating film 40, thereby forming an electrode wiring 43*c* on the interlayer film.

The IC part 50 is connected to the TFT 30 through the wiring part 37. That is, in the IC part 50, a contact hole 44*c* is formed on the electrode wiring 43*c* on the interlayer film to penetrate the flattening film 42. In the pixel part 51, a contact hole 44*b* is formed on the electrode wiring 43*b* on the interlayer film in the TFT 30 to penetrate the flattening film 42. The wiring part 37 that is a transparent electrode is pattern-formed inside the contact holes 44*b* and 44*c* and on the flattening film 42, thereby connecting the electrode wirings 43*b* and 43*c* on the interlayer film to each other.

Thus, in the semiconductor device of the present invention, the passivation film is arranged only in the pixel part, but not arranged in the IC part. Accordingly, the number of the insulating films on the gate in the pixel part is generally larger than that on the semiconductor layer in the IC part by the passivation film. That is, the thickness of the insulating film (the passivation film and the interlayer insulating film) on the gate in the pixel part is different from the thickness of the insulating film (interlayer insulating film) on the semiconductor layer in the IC part. The thickness of the insulating film on the gate in the pixel part is generally larger than the thickness of the insulating film on the semiconductor layer in the IC part. The passivation film is formed before the semiconductor layer in the IC part is thinned. Therefore, the passivation film is not formed on the semiconductor layer in the IC part. Accordingly, the passivation film of the present invention is clearly different in the arrangement configuration from an interlayer insulating film in an embodiment in which a pixel part and an IC part are integrally formed on a substrate and an interlayer insulating film is uniformly arranged over the entire substrate.

A production method of the active matrix substrate for display devices, in accordance with the present Embodiment, is mentioned below.

First, a step of producing the TFT 30 is mentioned. As shown in FIG. 2, a SiNO layer that is the first base coat layer 31 and a TEOS layer that is the second base coat layer 32 are stacked in this order on the glass substrate 22. The semiconductor thin film 33 including amorphous silicon, polysilicon, and the like is pattern-formed on the TEOS layer 32 surface by photolithography. The gate insulating film 34 that is an insulating film such as a $SiO_2$ film is stacked on the above-mentioned TEOS layer 32 to cover the above-mentioned semiconductor thin film 33. Then, the gate electrode 35 is pattern-formed by photolithography to partly cover the semiconductor thin film 33. Using this gate electrode 35 as a mask, an ion of an impurity element is injected into the source region 33*s* and the drain region 33*d* of the semiconductor thin film 33. The passivation film 36 with an average thickness of about 400 nm is formed on the gate electrode 34 to over the entire pixel part 51. The source region 33*s* and the drain region 33*d* are heat-treated, thereby activating the injected ion impurities. As a result, the TFT 30 is formed on the glass substrate 22.

The passivation film 36 may be formed by a sputtering method, a normal-pressure CVD method, a low pressure CVD method, a plasma CVD method, a remote plasma CVD method and the like. The material for the passivation film 36 preferably has a large etching selection ratio to the semiconductor layer in the IC part. An insulating inorganic material is preferable as such a material. Examples of such a material include silicon oxide, silicon nitride and silicon oxynitride. TEOS is particularly preferable. A plurality of layers may form the passivation film 36, but preferably a single layer forms the passivation film 36 in view of simplification of the production steps.

In the present Embodiment, the passivation film 36 is formed before the IC part 50 is transferred. However, in the present invention, the passivation film may be formed on the gate in pixel part after the IC part is transferred as long as the gate in the pixel part can be protected. However, the gate in the pixel part which generally includes a metal material might be oxidized in the above-mentioned heat treatment step of activating the element impurities if the passivation film is formed over the entire substrate after the IC part is transferred. Accordingly, it is preferable that the passivation film is formed before the IC part is transferred, as in the present Embodiment, in order to prevent the gate in the pixel part from being oxidized in the heat treatment step.

Then, the passivation film 36, the TEOS layer 32, and the gate insulating film 34 in a specific region are removed by dry etching to expose a region of the glass substrate 22 to which the IC part 50 will be transferred, as shown in FIG. 3. Further, the exposed SiNO layer 31 is wet-etched, thereby partly exposing the glass substrate 22. Then, the IC part 50 is attached to the exposed glass substrate 22.

The production method of the IC part 50 is mentioned below. The production method of the IC part 50 includes an oxide film formation step, a gate electrode formation step, an active region formation step, a separation layer formation step, a flattening film formation step, a transferring step, a separation step, and a film thinning step.

In the oxide film formation step, a P-well region 4 is formed on a semiconductor substrate 1 that is a single crystal silicon wafer a part of which corresponds to the above-mentioned semiconductor substrate 1 before being separated), and simultaneously, the LOCOS oxide film 6 and the gate oxide film 7 are formed. That is, as shown in FIG. 4-1, a thermal oxide film 2 is formed on the semiconductor substrate 1, and an ion of a P-type impurity element 9 (for example, boron) is injected into the semiconductor substrate 1. As shown in FIG. 4-2, the above-mentioned semiconductor substrate 1 is heat-treated, thereby diffusing and activating the injected ions of the P-type impurity element 9. As a result, the P-well region 4 is formed. As shown in FIG. 4-3, a silicon nitride film 5 is pattern-formed on the thermal oxide film 2 surface. Then, LOCOS oxidation is performed for the thermal oxide film 2 and the semiconductor substrate 1, thereby forming the LOCOS oxide film 6 on the right and left sides of the silicon nitride film 5. Then, as shown in FIG. 4-4, the silicon nitride film 5 and the thermal oxide film 2 are once removed. Then, the gate oxide film 7 is formed in the region where the thermal oxide film 2 was formed.

Then, in the gate electrode formation step, a conductive material stacked on the gate oxide film 7 surface by a sputtering method and the like is patterned by a photolithography method, thereby forming the gate electrode 8 on the semiconductor substrate 1. Examples of a material for the gate electrode 8 include high melting point metals such as tungsten (W), molybdenum (Mo), tantalum (Ta), and titanium (Ti), and nitrides of such high melting point metals. The gate electrode may be a stacked body including two or more of the above-mentioned materials. A stacked film of tungsten (W) and tantalum nitride (TaN) may be mentioned, for example.

Then, in the active region formation step, as shown in FIG. 4-6, an ion of an N-type impurity element 16 such as phosphorus is injected using the gate electrode 8 as a mask, thereby forming N-type low concentration impurity regions 10*s* and 10*d*. Then, as shown in FIG. 4-7, a $SiO_2$ film is formed by a CVD and the like on the gate oxide film 7 surface and then anisotropically dry-etched, thereby forming a sidewall 11 on each side surface of the gate electrode 8. As shown in FIG. 4-8, the N-type impurity ions 16 such as phosphorus are injected using the gate electrode 8 and the side wall 11 as a mask, thereby forming N-type high concentration impurity regions 13*s* and 13*d*. As a result, the low concentration impurity regions 10*s* and 10*d* are formed to face the sidewall 11 with the gate oxide film 7 therebetween. As shown in FIG. 4-9, the insulating film 14 such as $SiO_2$ film is formed, and then the above-mentioned low concentration impurity regions 10*s* and 10*d*, and the high concentration impurity regions 13*s* and 13*d* are heat-treated, thereby activating the injected ions of the N-type impurity element 16.

Then, in the separation layer formation step, as shown in FIG. 4-10, the interlayer insulating film 15 is stacked on the insulating film 14 surface. Then, a substance for separation, that is, an ion of hydrogen or an inert gas element 24 such as helium (He) and neon (Ne) is injected into the P-well region 4 on the above-mentioned semiconductor substrate 1 through the above-mentioned interlayer insulating film 15. Thus, as shown in FIG. 4-10, a separation layer 17 including the substance for separation is formed on the semiconductor substrate 1.

In the flattening film formation step, as shown in FIG. 4-11, a $SiO_2$ film is formed to cover the semiconductor substrate 1 and the interlayer insulating film 15 and then flattened by CMP (Chemical Mechanical Polishing), thereby forming the interlayer insulating film 18. Then, the source electrode 20*s* and the drain electrode 20*d* are formed. First, as shown in FIG. 4-12, the contact holes 19*s* and 19*d* which penetrate the above-mentioned interlayer insulating films 18 and 15, the insulating film 14, and the gate oxide film 7 are formed. The contact hole 19*s* is formed on the above-mentioned high concentration impurity region (source region) 13*s*. The contact hole 19*d* is formed on the above-mentioned high concentration impurity region (drain region) 13*d*. Then, a conductive material is formed inside the contact holes 19*s* and 19*d* and on the interlayer insulating film 18 and then patterned. As a result, the source electrode 20*s* is formed above the contact hole 19*s*. The drain electrode 20*d* is formed above the contact hole 19*d*. Then, as shown in FIG. 4-13, the insulating film 21 is formed and flattened by CMP and the like.

In the transferring step, as shown in FIG. 5, the insulating film 21 surface in the IC part 50 is washed. Then, the flattened insulating film 21 is attached to the exposed glass substrate 22 surface. As a result, the semiconductor layer 1 in the IC part 50 is positioned on the side opposite to the glass substrate 22, that is, positioned as the uppermost layer in the MOS transistor 52 on the glass substrate 22.

In the separation step, a part of the semiconductor substrate 1 including the P-well region 4 is separated along the separation layer 17 by a heat treatment at a temperature of about 400 to 600° C., as shown in FIG. 6. Then, in the film thinning step, as shown in FIG. 7, the separation layer 17 is removed by etching and the like. Then, the channel region 12 is thinned, and simultaneously, the semiconductor layer 1 (single crystal silicon layer) is further etched to have an average thickness of about 100 nm in order to expose the LOCOS oxide film 6, thereby isolating the elements. In this case, the etching can be performed without using an etching mask because the passivation film 36 having a large etch selectivity is formed on the gate electrode 35 in the pixel part 51. The average thickness of the passivation film 36 is reduced from about 400 nm to about 150 nm after the etching.

Wet etching and dry etching maybe employed as the etching, but dry etching is preferable. A mixed gas of carbon tetrafluoride gas and oxygen gas, and the like, may be used as a gas for the dry etching. The etch selectivity between the single crystal silicon and the TEOS is 1.5 when the mixed gas of carbon tetrafluoride gas and oxygen gas is used.

A PE (plasma etching) mode, an RIE (reactive ion etching) mode and the like may be used for the dry etching.

If wet etching is employed, a potassium hydroxide aqueous solution, a mixed solution of fluoric acid and nitric acid, EDP (ethylene diamine pyrocatechol) and the like may be used as a reagent, for example.

The interlayer insulating film 40 including SiNx, TEOS and the like is formed by a CVD method and the like over the entire surface of thus-prepared pixel part and IC part. Then, as shown in FIG. 8, by dry etching, wet etching and the like, the contact holes 39*d* and 39*s* are formed on the drain region 33*d* and the source region 39*s* in the TFT 30, respectively, to penetrate the gate insulating film 34, the passivation film 36, and the interlayer insulating film 40, and the contact hole 38 is formed on the source electrode 20*s* in the IC part 50 to penetrate the interlayer insulating films 18 and 15, the insulating film 14, the LOCOS oxide film 6, and the interlayer insulating film 40. Then, a conductive material such as aluminum (Al) is formed inside the contact holes 39*s*, 39*d*, and 38 and on the interlayer insulating film 18 surface, and then patterned. As a result, the electrode wirings 43*a*, 43*b*, and 43*c* on the interlayer film are formed above the contact holes 19*a*, 19*d*, and 38, respectively.

Then, the flattening film 42 which is composed of a photosensitive resin and the like and has a thickness of a several micrometers is uniformly formed, by a spin coating method, on the entire surface of the interlayer insulating film 40 in the pixel part and the IC part. Then, the flattening film 42 is patterned by a photolithography method and the like, thereby forming the contact hole 44*c* on the electrode wiring 43*c* on the interlayer film in the IC part 50 and the contact holes 44*a* and 44*b* on the electrode wirings 43*a* and 43*b* on the interlayer film in the TFT 30. Then, a transparent conductive film such as an indium-tin oxide (ITO) film is formed inside each of the contact holes 44*a*, 44*b*, and 44*c*, and on the flattening film 42. Then, the transparent conductive film is patterned by a photolithography method and the like, thereby forming the wiring part 37 connecting the electrode wirings 43*b* and 43*c* on the interlayer film to each other, and the pixel electrode 41 connected to the electrode wiring 43*a* on the interlayer film. Finally, an alignment film (not shown) is formed to cover the entire surface of the pixel part 51. Through the above-mentioned steps, the pixel part 51 and the IC part 50 are formed on the glass substrate 22, and as a result, an active matrix substrate in the present Embodiment is produced.

As mentioned above, due to the passivation film 36 formed on the gate electrode 35 in the pixel part 51, the semiconductor layer 1 in the IC part 50 can be thinned without damages to the gate electrode 35. As a result, an active matrix substrate including the IC part 50 which is finely formed and have improved performances and a reduced electric power consumption can be produced.

A publicly known technology may be used to prepare a display device such as a liquid display device, including the active matrix substrate prepared in the present Embodiment. The production method of such a display device is not especially limited.

This Nonprovisional application claims priority under the Paris Convention and the domestic law in the country to be entered into national phase on Patent Application No. 2005-257040 filed in Japan on Sep. 5, 2005, the entire contents of which are hereby incorporated by reference.

BRIEF DESCRIPTION OF DRAWINGS

FIG. 4-1 is a cross-sectional view schematically showing a production flow of the NMOS transistor in accordance with Embodiment 1 (ion injection into the semiconductor substrate).

FIG. 4-2 is a cross-sectional view schematically showing a production flow of the NMOS transistor in accordance with Embodiment 1 (formation of the P-well region).

FIG. 4-3 is a cross-sectional view schematically showing a production flow of the NMOS transistor in accordance with Embodiment 1 (formation of silicon nitride film and LOCOS oxide film).

FIG. 4-4 is a cross-sectional view schematically showing a production flow of the NMOS transistor in accordance with Embodiment 1 (formation of gate oxide film).

FIG. 4-5 is a cross-sectional view schematically showing a production flow of the NMOS transistor in accordance with Embodiment 1 (formation of gate electrode).

FIG. 4-6 is a cross-sectional view schematically showing a production flow of the NMOS transistor in accordance with Embodiment 1 (ion injection into the P-well region).

FIG. 4-7 is a cross-sectional view schematically showing a production flow of the NMOS transistor in accordance with Embodiment 1 (formation of the sidewall).

FIG. 4-8 is a cross-sectional view schematically showing a production flow of the NMOS transistor in accordance with Embodiment 1 (ion injection into the N-type high concentration impurity region).

FIG. 4-9 is a cross-sectional view schematically showing a production flow of the NMOS transistor in accordance with Embodiment 1 (formation of the insulating film).

FIG. 4-10 is a cross-sectional view schematically showing a production flow of the NMOS transistor in accordance with Embodiment 1 (formation of the separation layer).

FIG. 4-11 is a cross-sectional view schematically showing a production flow of the NMOS transistor in accordance with Embodiment 1 (formation of the interlayer insulating film).

FIG. 4-12 is across-sectional view schematically showing a production flow of the NMOS transistor in accordance with Embodiment 1 (formation of the electrode).

FIG. 4-13 is a cross-sectional view schematically showing a production flow of the NMOS transistor in accordance with Embodiment 1 (formation of the insulating film).

FIG. 5 is a cross-sectional view schematically showing a production flow of the active matrix substrate in accordance with Embodiment 1 (attachment of the IC part to the glass substrate).

FIG. 6 is a cross-sectional view schematically showing a production flow of the active matrix substrate in accordance with Embodiment 1 (separation of the separation layer).

FIG. 7 is a cross-sectional view schematically showing a production flow of the active matrix substrate in accordance with Embodiment 1 (etching of the semiconductor layer).

FIG. 8 is a cross-sectional view schematically showing a production flow of the active matrix substrate in accordance with Embodiment 1 (formation of the interlayer insulating film and the electrode wiring on the interlayer film).

EXPLANATION OF NUMERALS AND SYMBOLS

Figure 1:
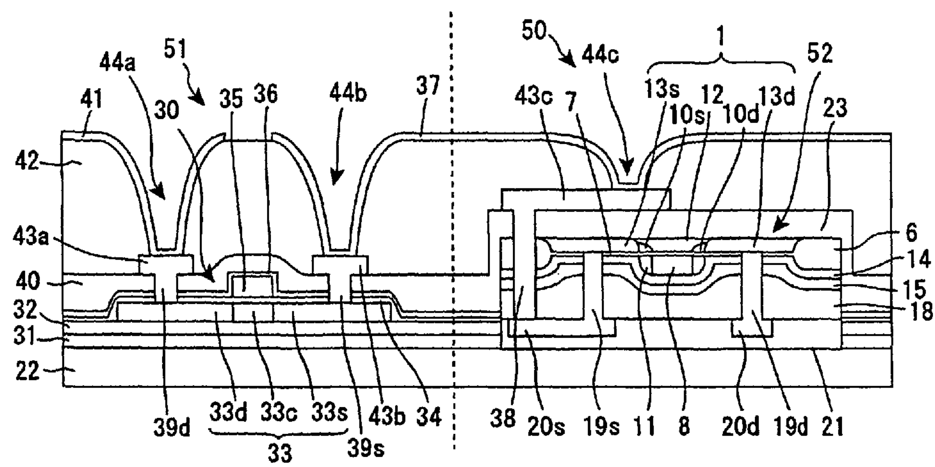
FIG. 1 is a cross-sectional view schematically showing a configuration of an active matrix substrate for display devices, including the semiconductor device of the present invention in accordance with Embodiment 1.
Figure 2:
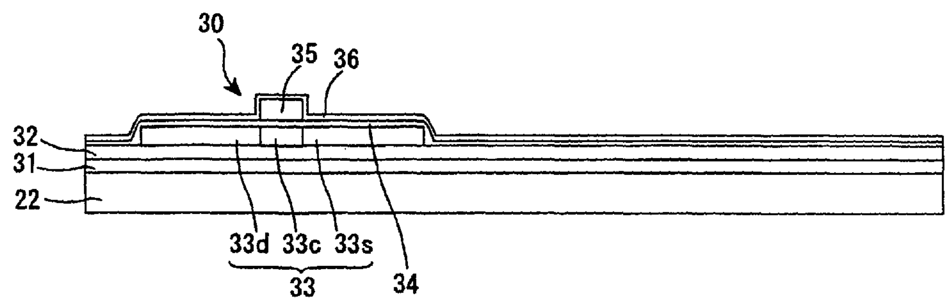
FIG. 2 is a cross-sectional view schematically showing a production flow of the active matrix substrate in accordance with Embodiment 1 (formation of TFT and passivation film).
Figure 3:
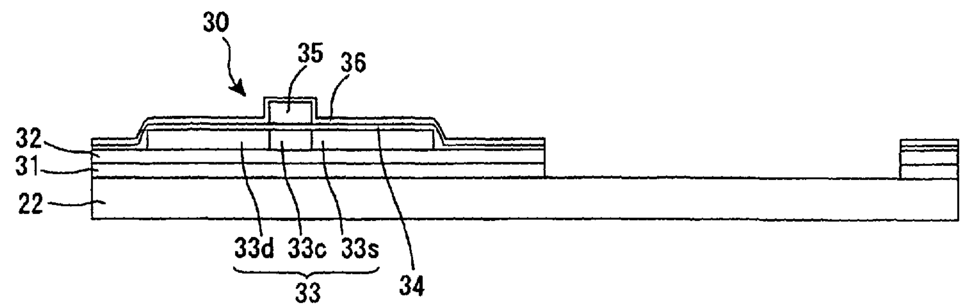
FIG. 3 is a cross-sectional view schematically showing a production flow of the active matrix substrate in accordance with Embodiment 1 (formation of exposure part).
Figures 1, 4:
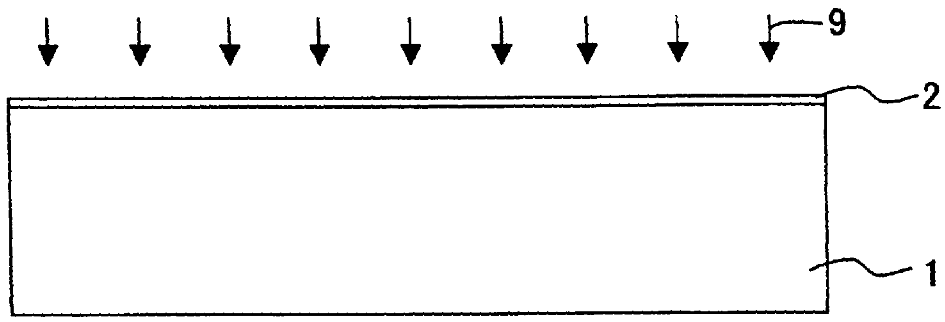
Figures 2, 4:
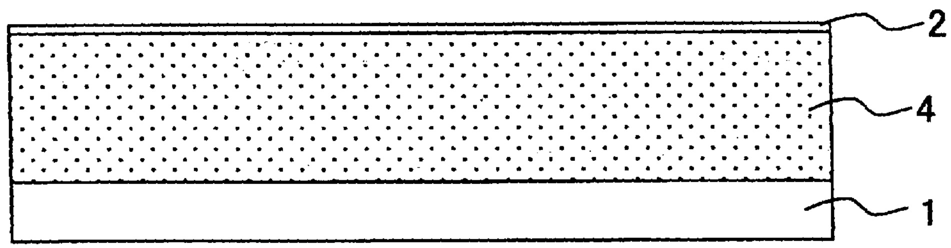
Figures 3, 4:
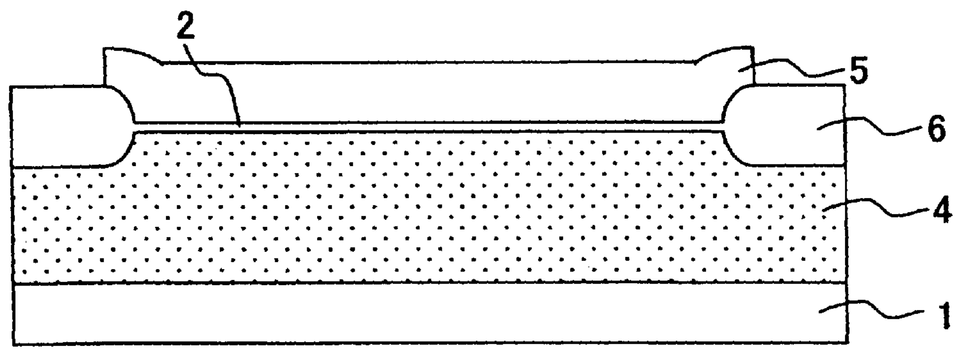
Figure 4:
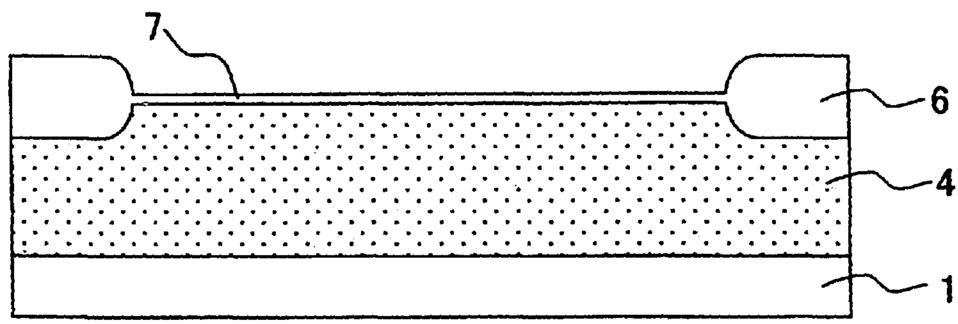
Figures 4, 5:
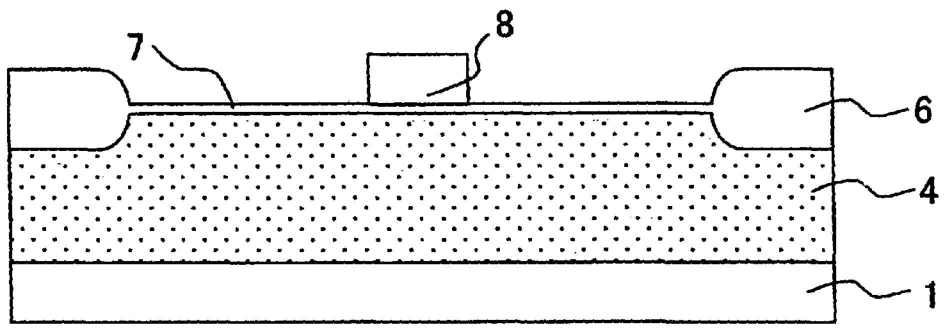
Figures 4, 5, 6:
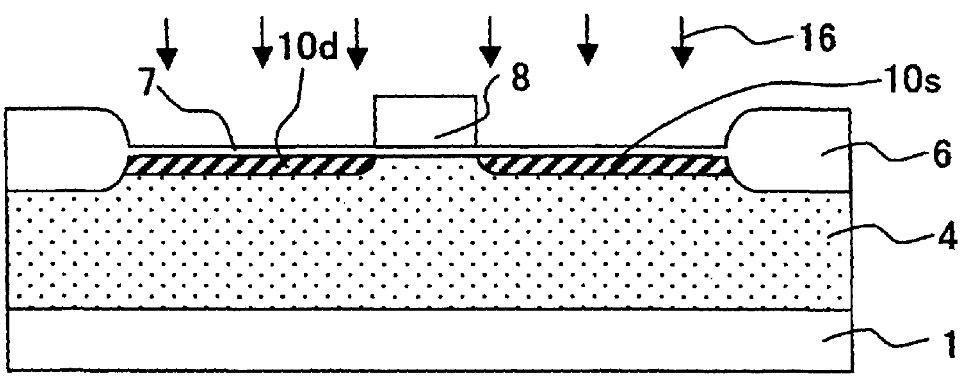
Figures 4, 5, 6, 7:
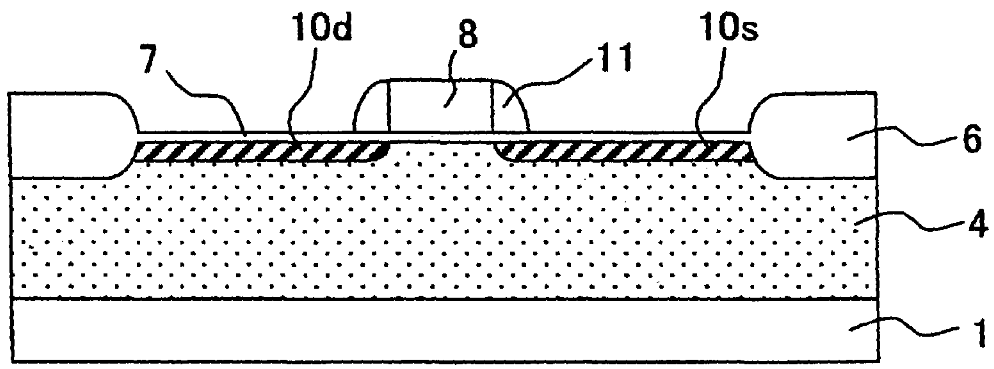
Figures 4, 5, 6, 7, 8:
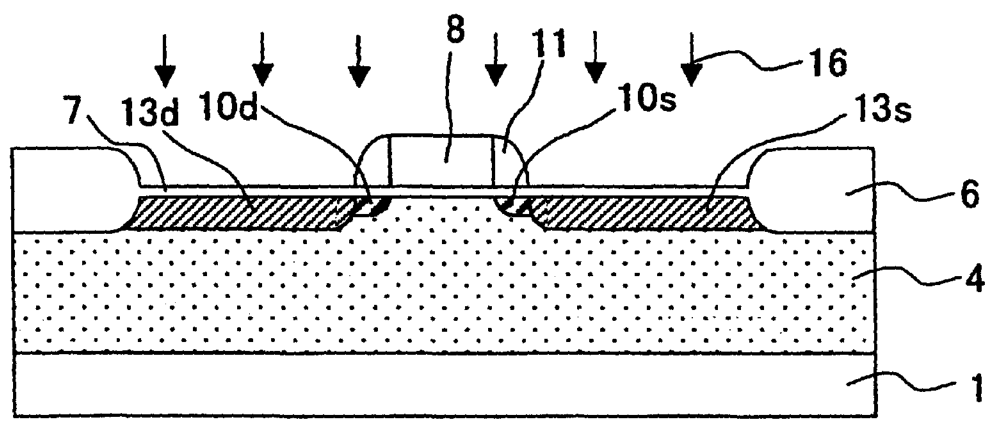
Figures 4, 5, 6, 7, 8, 9:
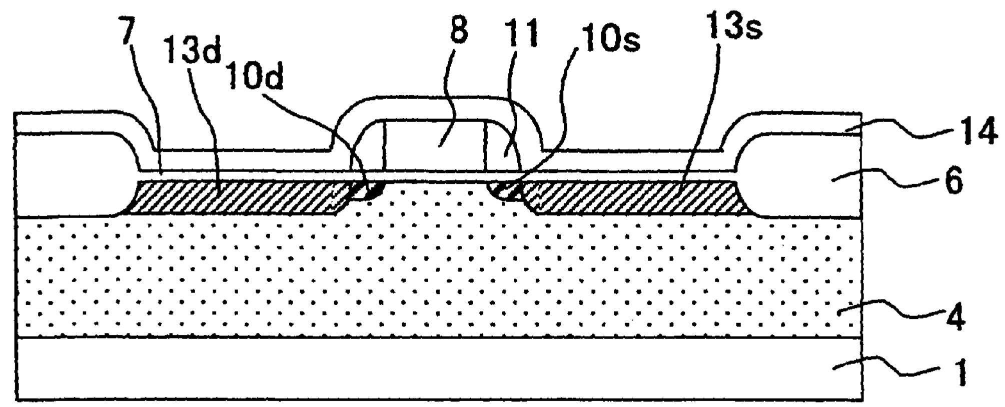
Figures 4, 5, 6, 7, 8, 9, 10:
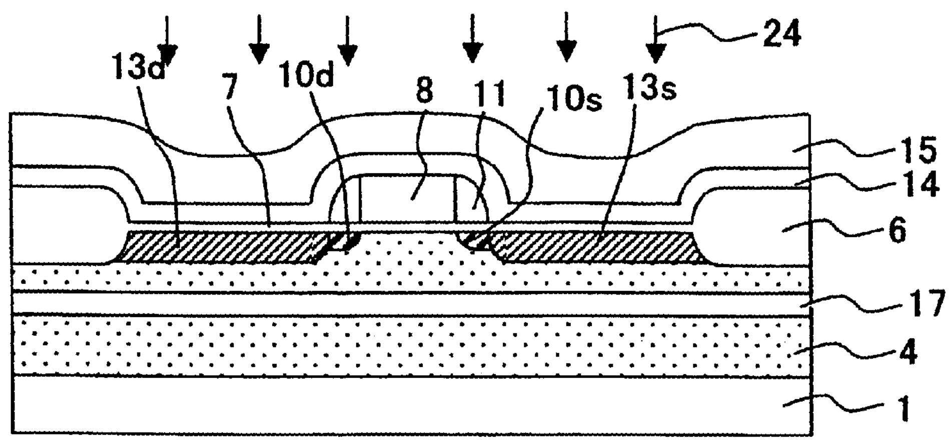
Figures 4, 5, 6, 7, 8, 9, 10, 11:
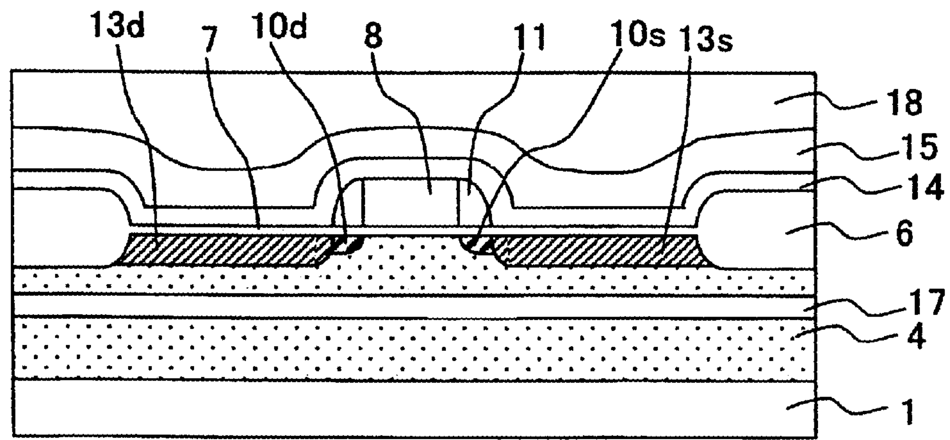
Figures 4, 5, 6, 7, 8, 9, 10, 11, 12:
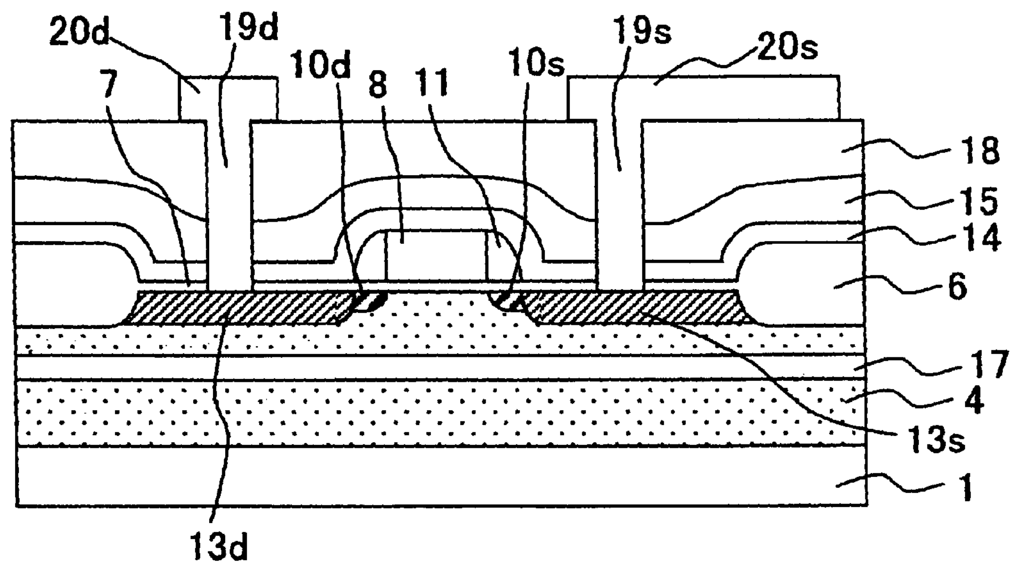
Figures 4, 5, 6, 7, 8, 9, 10, 11, 12, 13:
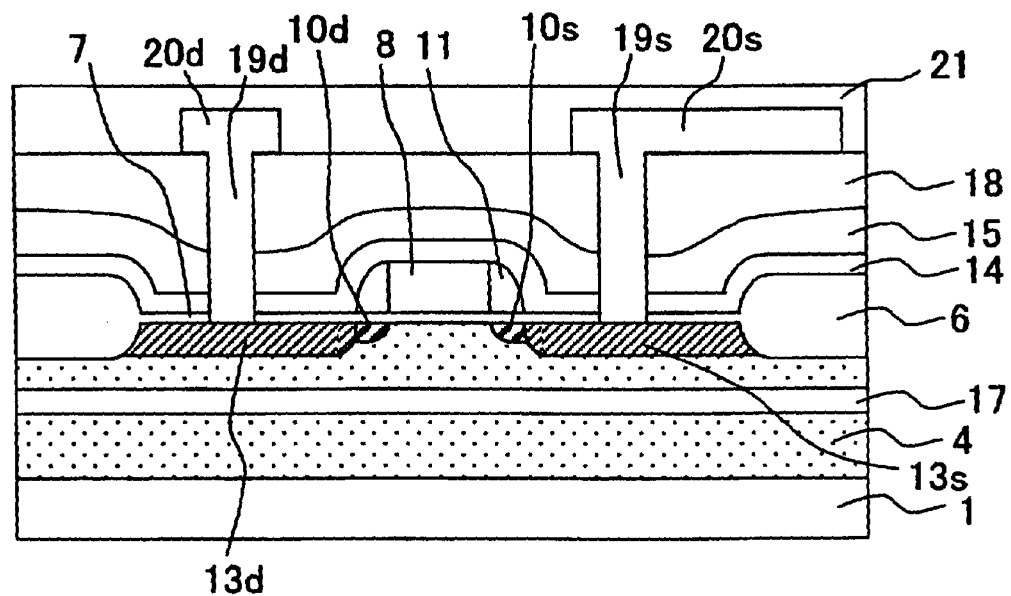
Figure 5:
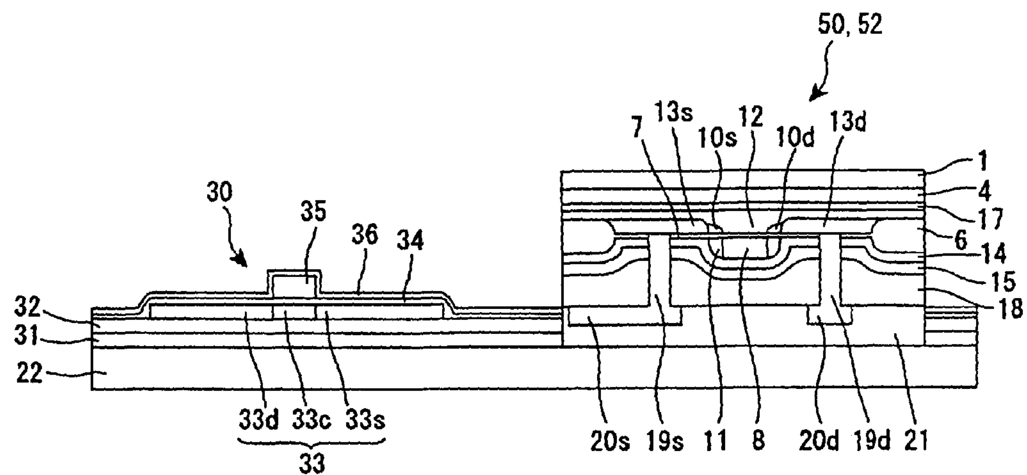
Figure 6:
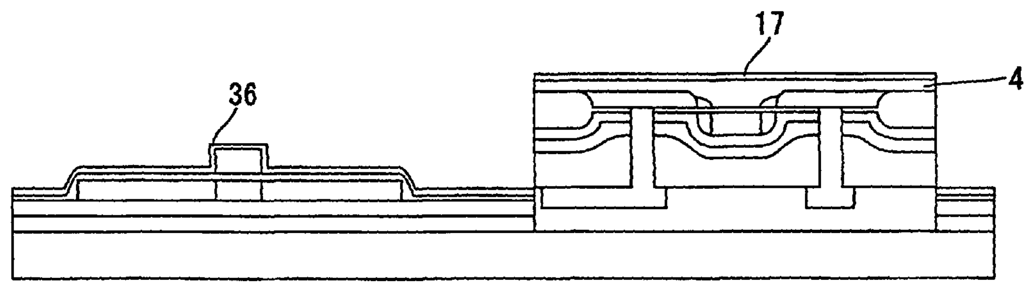
Figure 7:
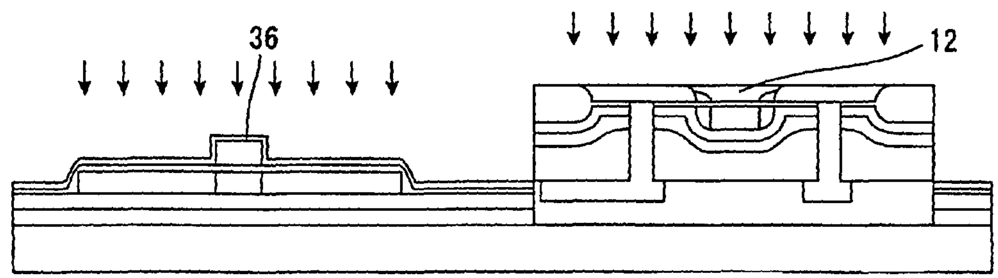
Figure 8:
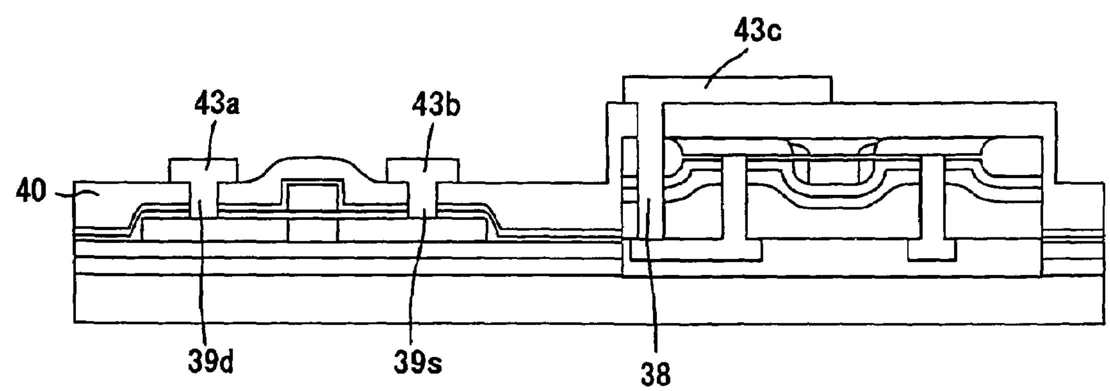

1: Semiconductor layer, semiconductor substrate
2: Thermal Oxide film
4: P-well region
5: Silicon nitride film
6: LOCOS oxide film
7: Gate oxide film
8: Gate electrode (gate in integrated circuit part)
9: P-type impurity element
10*s*, 10*d*: Low concentration impurity region
11: Sidewall
12: Channel region
13*s*, 13*d*: High concentration impurity region
14: Insulating film
15: Interlayer insulating film
16: N-type impurity element
17: Separation layer
18: Interlayer insulating film
19*s*, 19*d*: Contact hole
20*s*: Source electrode
20*d*: Drain electrode
21: Insulating film
22: Glass substrate
23: Passivation film
24: Hydrogen or inert gas element
30: TFT
31: First base coat layer (SiNO layer)
32: Second base coat layer (TEOS Layer)
33: Semiconductor thin film
33*s*: Source region
33*d*: Drain region
33*c*: Channel region
34: Gate insulating film
35: Gate electrode (gate in pixel part)
36: Passivation film
37: Wiring part
38, 39*s*, 39*d*, 44*a*, 44*b*, 44*c*: Contact hole
40: Interlayer insulating film
41: Pixel electrode
42: Flattening film
43*a*, 43*b*, 43*c*: Electrode wiring (on the interlayer film)
50: IC part
51: Pixel part
52: MOS transistor

The invention claimed is:

1. A semiconductor device comprising a first thin film element and a second thin film element on an insulating substrate,
the first thin film element including a metal electrode or a metal wiring on a first semiconductor thin film with an insulating film therebetween,
the second thin film element including a second semiconductor layer,
wherein a passivation film is formed in the first thin film element, and
the passivation film is arranged only in a pixel part, and the passivation film is formed over a gate electrode in the first thin film element wherein the passivation film is in direct contact with the gate electrode.

2. The semiconductor device according to claim 1, wherein the passivation film comprises a material having an etch selectivity of 1.5 or more relative to the second semiconductor layer in the second thin film element.

3. The semiconductor device according to claim 1, wherein the passivation film has an average thickness of 50 nm or more.

4. The semiconductor device according to claim 1, wherein the first semiconductor thin film comprises polysilicon, amorphous silicon, or continuous grain silicon.

5. The semiconductor device according to claim 1, wherein the second semiconductor thin film comprises single crystal silicon.

6. The semiconductor device according to claim 1, wherein an interlayer insulating film is formed on the passivation film.

7. A display device comprising the semiconductor device of claim 1.

8. The display device according to claim 7, wherein the display device is a liquid crystal display device.

9. A semiconductor device comprising
a pixel part and an integrated circuit part on a substrate,
the pixel part including a switching element having a gate electrode formed on a semiconductor thin film with a gate insulating film therebetween,
the integrated circuit part including a semiconductor layer on a gate electrode with a gate oxide film therebetween,
wherein a passivation film is formed on the gate electrode in the pixel part, and
the passivation film is formed only in the pixel part wherein the passivation film is in direct contact with the gate electrode.

10. The semiconductor device according to claim 9, wherein the passivation film comprises a material having an etch selectivity of 1.5 or more relative to the semiconductor layer in the integrated circuit part.

11. The semiconductor device according to claim 9, wherein the passivation film has an average thickness of 50 nm or more.

12. The semiconductor device according to claim 9, wherein the semiconductor thin film in the pixel part comprises amorphous silicon or polysilicon.

13. The semiconductor device according to claim 9, wherein the semiconductor layer in the integrated circuit part comprises single crystal silicon.

14. The semiconductor device according to claim 9, wherein an interlayer insulating film is formed on the passivation film.

15. A display device comprising the semiconductor device of claim 9.

16. The display device according to claim 15, wherein the display device is a liquid crystal display device.

17. A semiconductor device comprising:
a pixel part and an integrated circuit part supported by a substrate,
the pixel part including a switching element having a gate electrode formed on a semiconductor thin film with at least a gate insulating film therebetween,
the integrated circuit part including a semiconductor layer on a gate electrode with at least a gate insulating film therebetween,
wherein a passivation film is formed over the gate electrode in the pixel part, and
the passivation film is formed only in the pixel part wherein the passivation film is in direct contact with the gate electrode.

* * * * *